United States Patent
Yang et al.

(10) Patent No.: US 11,480,349 B2
(45) Date of Patent: Oct. 25, 2022

(54) OUTDOOR UNIT OF AIR CONDITIONER

(71) Applicant: SAMSUNG ELECTRONICS CO., LTD., Suwon-si (KR)

(72) Inventors: Wan-soo Yang, Suwon-si (KR); Tae-woo Kang, Suwon-si (KR); Sung-tae Kim, Hwaseong-si (KR); Seong-hwan Jang, Suwon-si (KR); Wang-byung Chae, Yongin-si (KR); Jei-min Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/964,035

(22) PCT Filed: Feb. 14, 2018

(86) PCT No.: PCT/KR2018/001977
§ 371 (c)(1),
(2) Date: Jul. 22, 2020

(87) PCT Pub. No.: WO2019/146832
PCT Pub. Date: Aug. 1, 2019

(65) Prior Publication Data
US 2021/0041116 A1 Feb. 11, 2021

(30) Foreign Application Priority Data

Jan. 26, 2018 (KR) .......................... 10-2018-0010043

(51) Int. Cl.
*F24F 1/26* (2011.01)
*F24F 1/20* (2011.01)

(52) U.S. Cl.
CPC . *F24F 1/26* (2013.01); *F24F 1/20* (2013.01)

(58) Field of Classification Search
CPC ...... F24F 1/26; F24F 1/20; F24F 1/24; H05K 7/20; H05K 7/2039
(Continued)

(56) References Cited

U.S. PATENT DOCUMENTS

2012/0312046 A1* 12/2012 Kim .......................... F24F 1/24
62/259.2
2017/0146249 A1 5/2017 Choi et al.
2018/0187905 A1* 7/2018 Doi .......................... F25D 31/00

FOREIGN PATENT DOCUMENTS

JP 2011220654 A * 11/2011
JP 5125355 11/2012
(Continued)

OTHER PUBLICATIONS

International Search Report dated Oct. 18, 2018 from International Application No. PTC/KR2018/001977, 4 pages.
(Continued)

*Primary Examiner* — Steve S Tanenbaum
(74) *Attorney, Agent, or Firm* — Staas & Halsey LLP

(57) ABSTRACT

An outdoor unit of an air conditioner includes a compressor that compresses a first refrigerant introduced from an indoor unit of the air conditioner and a condenser that condenses the first refrigerant compressed by the compressor. A first driving circuit drives the compressor and a second driving circuit regulates a voltage of the first driving circuit. A cooling unit includes: a heat dissipation member that comes into thermal contact with the first driving circuit and the second driving circuit, and a refrigerant pipe that is provided in the heat dissipation member, and has a path along which a second refrigerant moves through the first driving circuit and the second driving circuit. As a result, it is possible to efficiently cool the first driving circuit and the second driving circuit.

8 Claims, 17 Drawing Sheets

(58) Field of Classification Search
USPC .......................................................... 62/498
See application file for complete search history.

(56) References Cited

FOREIGN PATENT DOCUMENTS

| | | |
|---|---|---|
| JP | 5505055 | 5/2014 |
| JP | 2017-28825 | 2/2017 |
| KR | 10-2012-0135771 | 12/2012 |
| KR | 10-2014-0144480 | 12/2014 |
| KR | 10-2015-0031574 | 3/2015 |
| KR | 10-2015-0125530 | 11/2015 |
| KR | 10-2017-0046967 | 5/2017 |
| WO | 2017/022001 | 2/2017 |
| WO | 2017/069485 A1 | 4/2017 |

OTHER PUBLICATIONS

Korean Office Action dated Feb. 24, 2022 from Korean Application No. 10-2018-0010043.
Korean Office Action dated Aug. 11, 2022 for Korean Application No. 10-2018-0010043.

* cited by examiner

FIG. 17
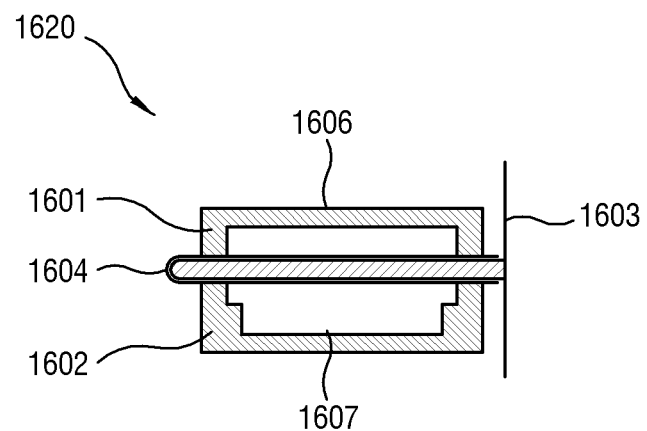
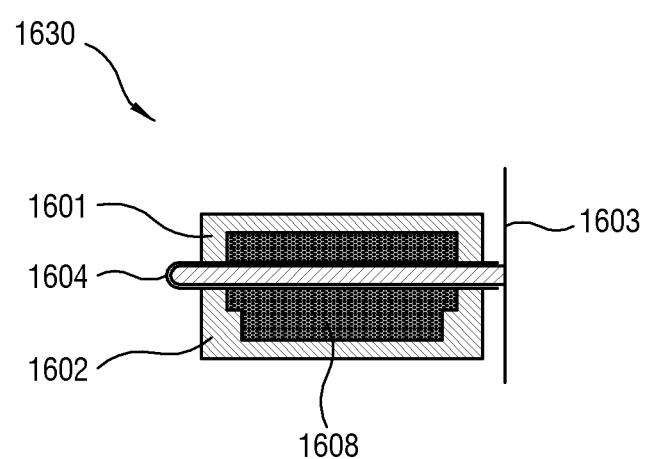
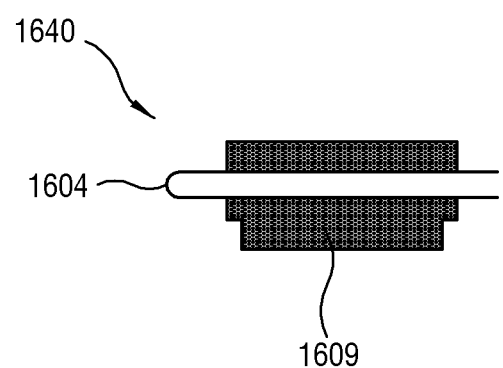

OUTDOOR UNIT OF AIR CONDITIONER

CROSS-REFERENCE TO RELATED APPLICATIONS

This application is a U.S. National Stage Application which claims the benefit under 35 U.S.C. § 371 of International Patent Application No. PCT/KR2018/001977 filed on Feb. 14, 2018, which claims foreign priority benefit under 35 U.S.C. § 119 of Korean Patent Application No. 10-2018-0010043 filed on Jan. 26, 2018 in the Korean Intellectual Property Office, the contents of each of which are incorporated herein by reference.

TECHNICAL FIELD

The present disclosure relates to an outdoor unit of an air conditioner, and more particularly, to a cooling unit that comes into contact with a heating unit inside the outdoor unit to cool the heating unit.

BACKGROUND ART

An air conditioner is a device that can remove dust and the like in the air while controlling temperature, humidity, and the like suitable for human activity by using a refrigerating cycle. The air conditioner may be configured to include an evaporator that evaporates a refrigerant to cool the surrounding atmosphere, a compressor that compresses a gaseous refrigerant discharged through the evaporator to high temperature and high pressure, and a condenser the condenses the gaseous refrigerant compressed by the compressor into a liquid state at room temperature, an expander that decompresses the liquid high-pressure refrigerant discharged through the condenser, and the like.

The air conditioner can be divided into a separate type and an integral type. Among those, the separate type air conditioner may be configured to include an indoor unit that is installed indoors to inhale indoor air and exchange heat with a refrigerant and discharge the heat-exchanged air back into the room, and an outdoor unit that exchanges heat between the refrigerant introduced from the indoor unit and outdoor air and exchanges heat with indoor air again and supplies the heat-exchanged refrigerant to the indoor unit. The outdoor unit may include the compressor and the condenser.

Recently, as a cooling capacity of the air conditioner increases, the capacity or number of compressors inside the outdoor unit is increasing, and a size of a driving circuit of a control box driving the compressor is getting larger. In order to reduce the size of the driving circuit for driving the compressor, it is possible to drive a plurality of compressors with one inverter. Since heat generation increases in the driving circuit by using one inverter, there is a need for an efficient cooling unit having a simple cooling path to cool the driving circuit.

DISCLOSURE

Technical Problem

Accordingly, an object of the present disclosure is to provide an outdoor unit of an air conditioner having an improved structure to cool a driving circuit in a control box, a cooling unit applied thereto, and a method of manufacturing the cooling unit.

Another object of the present disclosure is to provide an outdoor unit of an air conditioner having an improved structure to uniformly cool a plurality of heating units, a cooling unit applied thereto, and a method of manufacturing the cooling unit.

Technical Solution

According to an aspect of the present disclosure, an outdoor unit of an air conditioner includes: a compressor that compresses a first refrigerant introduced from an indoor unit of the air conditioner; a condenser that condenses the first refrigerant compressed by the compressor; a first driving circuit that drives the compressor; a second driving circuit that regulates a voltage of the first driving circuit; and a cooling unit, in which the cooling unit includes: a heat dissipation member that comes into thermal contact with the first driving circuit and the second driving circuit; and a refrigerant pipe that is provided in the heat dissipation member, and has a path along which a second refrigerant moves through the first driving circuit and the second driving circuit.

The first driving circuit may include an inverter circuit, and the second driving circuit may include a booster circuit.

The refrigerant pipe may penetrate through an inside of the heat dissipation member.

The path of the refrigerant pipe may move in the order of the first driving circuit and the second driving circuit.

The path of the refrigerant pipe may traverse the first driving circuit and the second driving circuit multiple times.

The path may include a path along which the second refrigerant passing through the second driving circuit is introduced into the first driving circuit again.

The refrigerant pipe may include a first refrigerant and a second refrigerant that face each other with the heat dissipation member provided therebetween, and include a plurality of third refrigerant pipes that transverse the heat dissipation member to make the first refrigerant pipe and the second refrigerant pipe communicate with each other.

The outdoor unit may further include: a control box that is provided with the first driving circuit and the second driving circuit, in which at least one of the heat dissipation member or the refrigerant pipe may be exposed outside the control box.

The control box may be provided with an opening that is at a location corresponding to at least one of the first driving circuit and the second driving circuit.

The outdoor unit may further include: an exterior case that houses the compressor, the condenser, and the control box.

A material of the pipe may include at least any one of copper, aluminum, or iron.

According to another aspect of the present disclosure, an air conditioner includes: an indoor unit; and an outdoor unit, in which the outdoor unit includes: a compressor that compresses a first refrigerant introduced from an indoor unit; a condenser that condenses the first refrigerant compressed by the compressor; a first driving circuit that drives the compressor; a second driving circuit that regulates a voltage of the first driving circuit; a heat dissipation member that comes into thermal contact with the first driving circuit and the second driving circuit; and a refrigerant pipe that is provided in the heat dissipation member, and has a path along which a second refrigerant moves through the first driving circuit and the second driving circuit.

Advantageous Effects

As described above, it is possible to efficiently cool the first driving circuit and the second driving circuit.

In addition, it is possible to improve the assembly performance of the refrigerant pipe.

In addition, it is possible to reduce the volume of the space in the control box occupied by the driving circuit.

DESCRIPTION OF DRAWINGS

FIGS. 16 and 17 are diagrams illustrating a process of manufacturing a cooling unit according to an embodiment of the present disclosure.

MODE FOR DISCLOSURE

Figure 1:
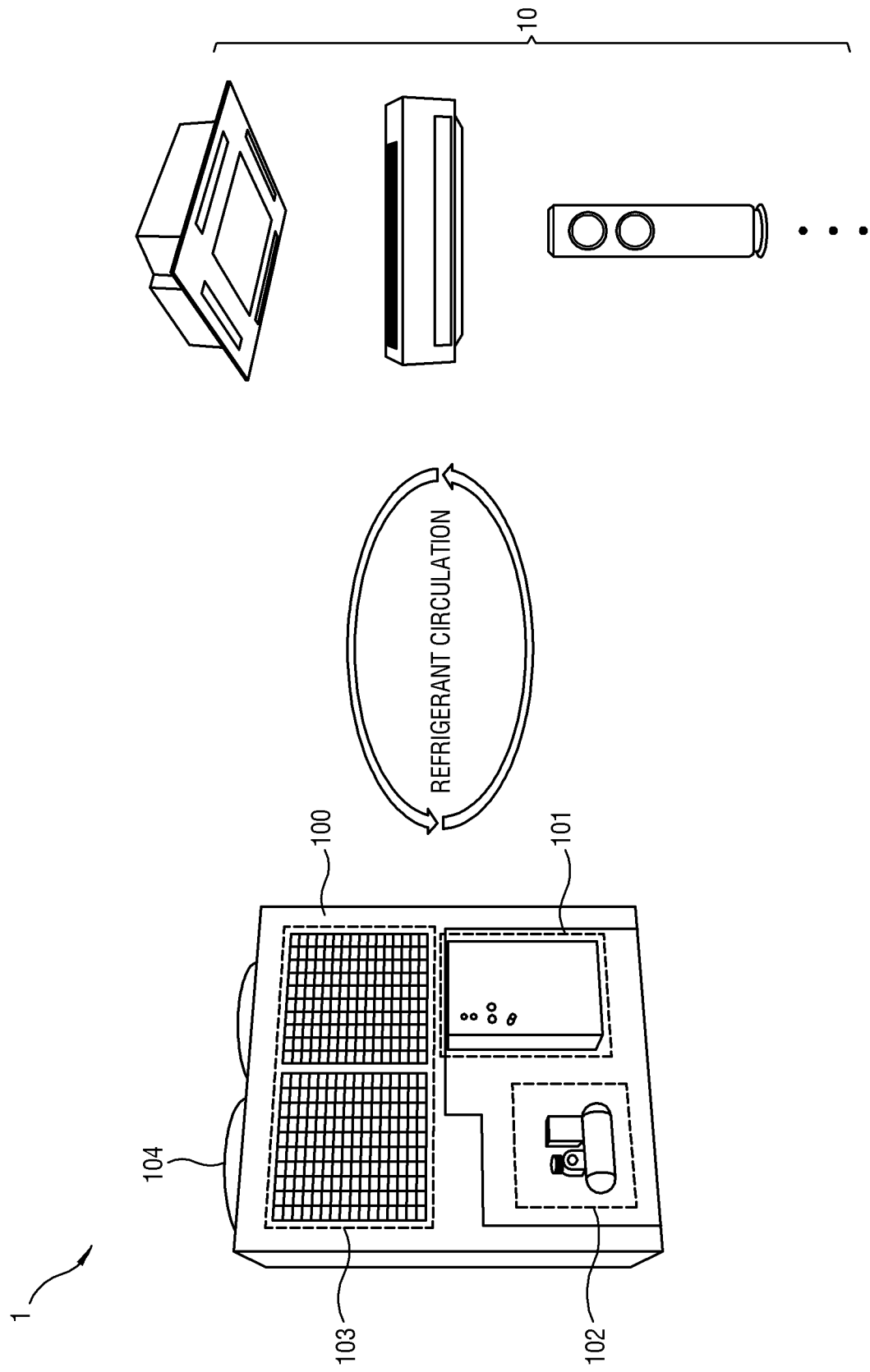
FIG. 1 is a diagram illustrating an air conditioner according to an embodiment of the present disclosure.

Hereinafter, embodiments of the present disclosure will be described in detail with reference to the accompanying drawings. In the drawings, the same reference numbers or signs refer to components that perform substantially the same function, and the size of each component in the drawings may be exaggerated for clarity and convenience. However, the technical idea and the core configuration and operation of the present disclosure are not limited only to the configuration or operation described in the following examples. In describing the present disclosure, if it is determined that a detailed description of the known technology or configuration related to the present disclosure may unnecessarily obscure the subject matter of the present disclosure, the detailed description thereof will be omitted.

In embodiments of the present disclosure, terms including ordinal numbers such as first and second are used only for the purpose of distinguishing one component from other components, and singular expressions include plural expressions unless the context clearly indicates otherwise. Also, in embodiments of the present disclosure, it should be understood that terms such as 'configured', 'include', and 'have' do not preclude the existence or addition possibility of one or more other features or numbers, steps, operations, components, parts, or combinations thereof. In addition, in the embodiment of the present disclosure, a 'module' or a 'unit' performs at least one function or operation, and may be implemented in hardware or software, or a combination of hardware and software, and may be integrated into at least one module and implemented as at least one processor.

The term "at least one" of a plurality of elements in the present specification is used to refer to not only all of the plurality of elements, but each one or a combination of components excluding the rest of the plurality of elements.

FIG. 1 illustrates an air conditioner according to an embodiment of the present disclosure. An air conditioner 1 is configured to include an indoor unit 10 and an outdoor unit 100. The indoor unit 10 and the outdoor unit 100 are connected to each other by a pipe in which a refrigerant is contained. A refrigerant introduced from the indoor unit 10 into the outdoor unit 100 undergoes a compression process by a compressor 102, a condensation process by a condenser 103, and an expansion process by an expansion valve (not illustrated), and then moves to the indoor unit 10 along the pipe. The refrigerant moving to the indoor unit 10 is evaporated in the indoor unit 10 and then moves to the outdoor unit 100 again. As described above, the refrigerant is heat exchanged while circulating the outdoor unit 100 and the indoor unit 10 through the pipe, and thus the air conditioner 1 may provide dehumidified air or low-temperature air to a user.

The indoor unit 10 may be provided as a system type indoor unit, a wall mounted type indoor unit, or a stand type indoor unit. A structure and shape of the indoor unit 10 are not limited to those listed above, and the embodiment of the present disclosure may further include other types of indoor units.

The outdoor unit 100 may operate by connecting to one or two or more indoor units 10. Alternatively, the indoor unit 10 may operate by connecting to a plurality of outdoor units 100. One or two or more compressors 102 may be provided inside the outdoor unit 100. When two or more compressors 102 are provided in the outdoor unit 100, specifications of the compressor 102 may be different. Hereinafter, the outdoor unit 100 will be described.

The outdoor unit 100 according to the embodiment of the present disclosure may be provided in the form of a hexahedron. The outdoor unit 100 may include a control box 101, a compressor 102, a condenser 103, and a fan 104. The configuration of the outdoor unit 100U is not limited thereto, and the outdoor unit 100 may be provided in other forms, and the outdoor unit 100 may additionally include other components. A case of the outdoor unit may be provided to house the components of the outdoor unit listed above. Hereinafter, the control box 101, the compressor 102, the condenser 103, and the fan 104 that are included in the outdoor unit 100 will be described.

The control box 101 may be located at a portion of a lower end portion in the outdoor unit 100. The control box 101 will be described with reference to FIGS. 3 and 4.

The compressor 102 may be located at a portion of the lower end portion in the outdoor unit 100. The compressor 102 compresses a refrigerant, and moves the compressed refrigerant to the condenser 103 through a refrigerant pipe (17 in FIG. 2).

The condenser 103 may be located at a portion of an upper end portion in the outdoor unit 100. Hot air due to heat generated from the condenser 103 may be discharged to the upper end portion of the outdoor unit 100 by convection.

The fan 104 may be located at a portion between the upper end portion in the outdoor unit 100 and the condenser 103. The fan 104 may be located at an upper portion of the outdoor unit 100 so that the introduced air is heat exchanged and then is smoothly discharged. However, this is only one embodiment, and the location of the fan 104 is not limited to the upper portion of the outdoor unit 100 and may be changed according to design.

Figure 2:
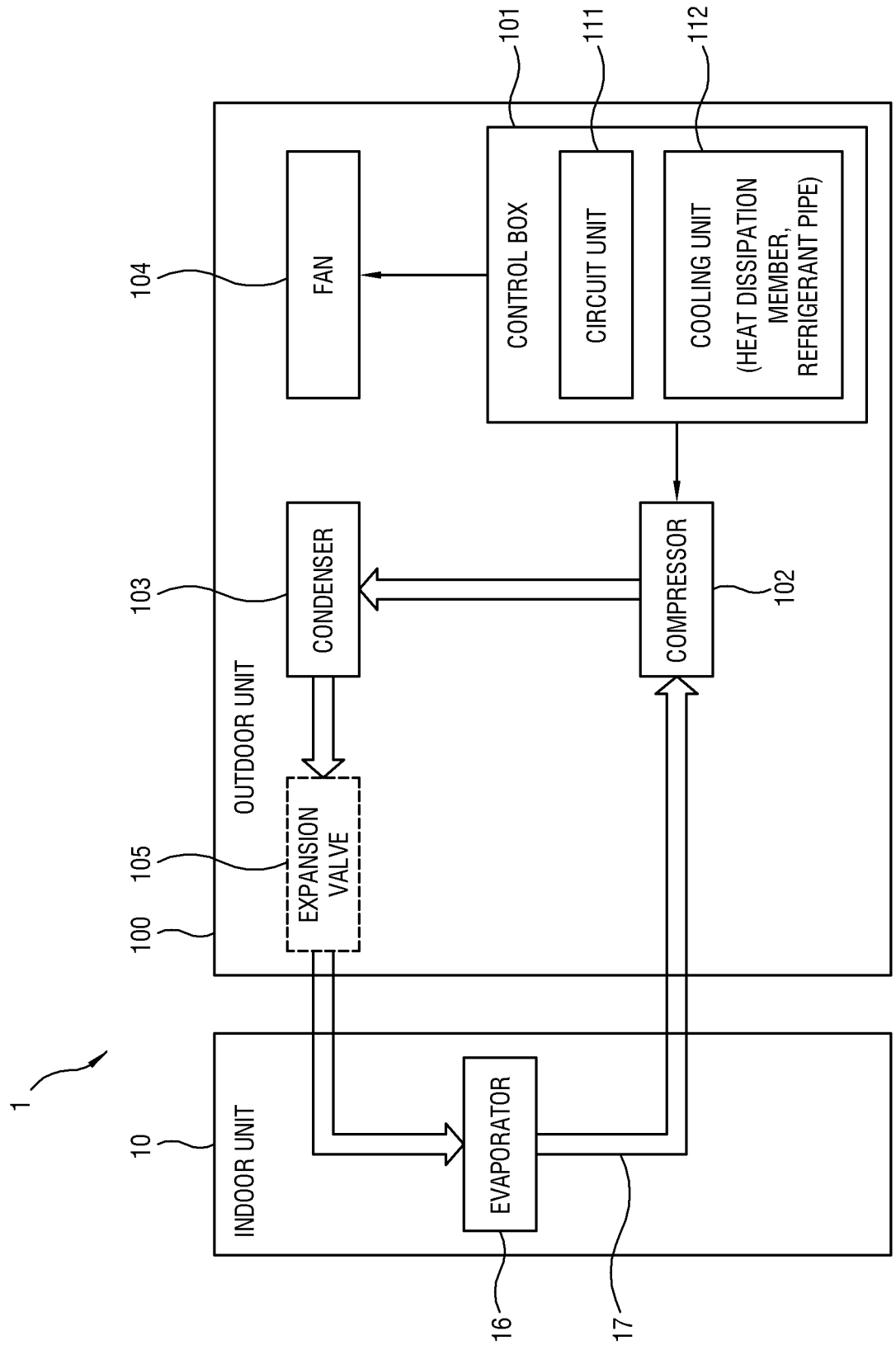
FIG. 2 is a block diagram of the air conditioner according to the embodiment of the present disclosure.

FIG. 2 illustrates a block diagram of the air conditioner according to the embodiment of the present disclosure. The air conditioner 1 may be configured to include the outdoor unit 100U, the indoor unit 10, and the refrigerant pipe 17. The outdoor unit 100 may include the control box 101, the compressor 102, the condenser 103, and an expansion valve 105. The indoor unit 10 may include an evaporator 16. The expansion valve 105 may be included in the outdoor unit 100 or the indoor unit 10. The configuration of the outdoor unit 100 and the indoor unit 10 according to the embodiment of the present disclosure is not limited thereto, and the outdoor 100 and the indoor unit 10 may further include other components. Hereinafter, the configuration and function of the outdoor unit 100 will be described.

The compressor 102 may compress a gaseous refrigerant introduced through the pipe from the indoor unit 10 under the control of the control box 101. According to the compression scheme of the compressor 102, the compressor 102 is classified into a constant speed type, a twin power cooling system (TPS), and an inverter. The constant-speed type compressor operates without changing a rotation speed of a compressor motor, so the power consumption is constant. The TPS compressor selectively or simultaneously operates using two compressors of different capacities, so the power consumption may be different. The inverter type compressor converts DC power into AC power, and may control the compressor 102 to operate at high speed or low speed according to the use condition or the user's operation of the air conditioner 1. Therefore, the inverter type compressor can control the power consumption through variable power supplied from the inverter depending on the situation, and as a result, has high efficiency. The inverter may be included in the control box 101. The inverter is described together with the control box 101. The compressor 102 according to the embodiment of the present disclosure is not limited thereto, and the embodiment of the present disclosure may further another type of compressor 102.

The condenser 103 may be compressed to high temperature and high pressure by the compressor 102 to dissipate heat of the discharged refrigerant by heat exchange, thereby liquefying the refrigerant. The condenser 103 is classified into a water cooling type, an evaporation type, and an air cooling type. The condenser 103 according to the embodiment of the present disclosure is not limited thereto, and the embodiment of the present disclosure may further another type of condenser 103. In the air cooling type condenser 103, the fan 104 may be provided inside the outdoor unit 100 to dissipate heat.

The fan 104 may introduce air outside the outdoor unit 100 into the inside or discharge air inside the outdoor unit 100 to the outside under the control of the control box 101. Accordingly, the air circulation inside and outside the outdoor unit 100 may be performed by the fan 104. The circulated air may exchange heat with the condenser 103. By the circulation by the fan 104, the heat-exchanged air may be discharged outside the outdoor unit 100.

The expansion valve 105 may expand the refrigerant condensed by the condenser 103. Since the pressure and temperature of the expanded refrigerant are lowered, the expanded refrigerant may be easily evaporated from the evaporator 16. The expansion valve 105 is classified into a manual type, a static pressure type, and a temperature type, and may be provided in the outdoor unit 100 or the indoor unit 10. The expansion valve 105 may be controlled by the control box 101 according to the type. The expansion valve 105 according to the embodiment of the present disclosure is not limited thereto, and the embodiment of the present disclosure may further include another type of expansion valve 105.

The evaporator 16 may evaporate the refrigerant expanded by the expansion valve 105. The evaporator 16 may cool an object (air and the like) to be cooled by heat exchange using evaporation latent heat of the refrigerant. The air cooled by the heat exchange is provided to the user by the indoor unit 10. Thereafter, the heat-exchanged refrigerant moves to the compressor 102 of the outdoor unit 100 through the pipe. As such, the refrigerant may circulate a refrigerating cycle in which the refrigerant passes through the compressor 102, the condenser 103, the expansion valve 105, and the evaporator 16 and returns to the compressor 102 again.

The refrigerant pipe 17 is provided to enable the movement of the refrigerant. The refrigerant pipe 17 may be provided to sequentially connect between the refrigerant between the compressor 102, the condenser 103, the expansion valve 105, the evaporator 16, and the compressor 102 in order to circulate the refrigerant.

The control box 101 controls driving of the compressor 102 and the fan 104. The control box 101 may include a circuit unit 111 and a cooling unit 112. The cooling unit 112 may include a heat dissipation member and a refrigerant pipe. In the present disclosure, the refrigerant pipe 17 is described as having an independent circulation path separately from a refrigerant pipe 306. However, the refrigerant pipe 17 and the refrigerant pipe 306 may be connected to each other depending on the design. The configuration of the control box 101 is not limited thereto, and the control box 101 may further include other components. The circuit unit 111 included in the control box 101 may include an inverter circuit and a booster circuit that are used to drive the compressor 102. The circuit unit 111 may further include circuits necessary to control driving of other components.

An inverter circuit included in the circuit unit 111 performs a function of converting DC power into AC power. The booster circuit included in the circuit unit 111 functions to boost a voltage of the AC power converted by the inverter circuit. Heat generated from the inverter circuit and the booster circuit is dissipated to the outside of the control box 101 through the cooling unit 112. When the plurality of compressors 102 are provided, the plurality of inverter circuits of the circuit unit 111 may be provided corresponding to the plurality of compressors 102. Alternatively, one inverter circuit may be provided to supply power to the plurality of compressors 102. As one inverter circuit is used, the volume of the space in the control box 101 occupied by the circuit 111 may be reduced.

The cooling unit 112 may be provided on one surface outside the control box 101 corresponding to the location of the circuit unit 111. The cooling unit 112 may receive heat from the circuit unit 111 and dissipate the heat to the outside. The heat dissipation member of the cooling unit 112 may be made of metal materials such as copper, aluminum, or iron. The heat dissipation member may be provided in the form of a heat sink, a heat sink fin, or the like. The form of the heat dissipation member is not limited thereto, and the heat dissipation member may further include other forms.

The inside of the refrigerant pipe of the cooling unit 112 may be provided with a path along which the refrigerant moves. The refrigerant pipe may receive heat from the heat dissipation member to cool the heat dissipation member. The refrigerant pipe can configure an independent refrigerant circulation path. Alternatively, the refrigerant pipe may be connected to the refrigerant pipe 17 connecting between the outdoor unit 100 and the indoor unit 10.

Figure 3:
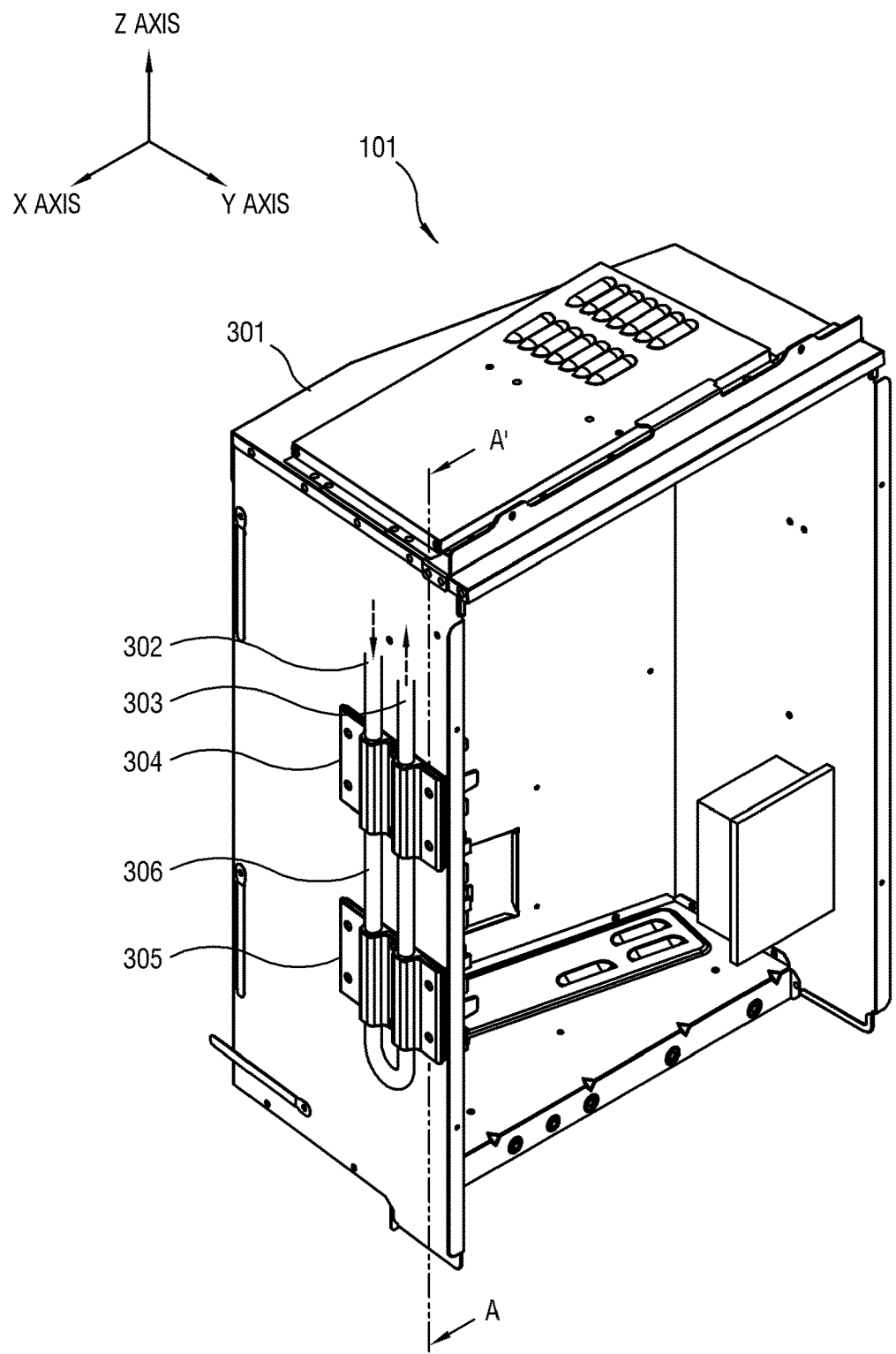
FIG. 3 is a perspective view of a control box according to an embodiment of the present disclosure.

FIG. 3 is a perspective view of the control box according to the embodiment of the present disclosure. The control box 101 can control the operation of the outdoor unit 100 of the air conditioner 1. The control box 101 may include a case 301, a circuit unit (see 401 and 402 in FIG. 4), heat dissipation members 304 and 305, and a refrigerant pipe 306. The case 301 may be provided in the form of a hexahedron, and one of a bottom surface and a side surface of the case 301 may be opened. A shape of the case 301 is not limited to the hexahedron, and the case 301 may be provided in other shapes. Hereinafter, the present disclosure will describe the directions in the drawings necessary for the description of the drawings.

In the following drawings of the present specification, three directions of X, Y, and Z perpendicular to each other in the space may be represented. Directions opposite to each direction of X, Y, and Z directions are represented by −X, −Y, and −Z. In the following embodiment, a direction of one surface in which the heat dissipation members 304 and 305 are provided inside the control box 101 may be represented by the X direction for convenience, and a direction of one surface opposite to the one surface on which the heat dissipation members 304 and 305 may be represented by the −X direction. The direction opened from the inside of the control box 101 to the side surface may be represented by the Y-axis direction, and the direction opposite to the direction opened from the inside of the control box 101 to the side surface may be represented by the −Y direction. The direction in which the bottom surface of the control box 101 inside the control box 101 is present may be represented by the −Z direction, and the direction in which one surface opposite to the bottom surface of the control box 101 inside the control box 101 is present may be represented by the Z direction. In addition, for a plane parallel to two of three-way axes, the other one axis is a normal direction. For example, in a Y-Z plane, the X-axis direction is a normal direction. Hereinafter, the configuration of the control box 101 will be described.

Circuit units 401 and 402 may be provided on an inner surface of one surface of the case 301. The circuit units 401 and 402 will be described with reference to FIG. 4. The heat dissipation members 304 and 305 may be provided on an outer surface of the case 301 in the X-axis direction corresponding to the locations of the circuit units 401 and 402. The heat dissipation members 304 and 305 may dissipate heat generated from the circuit units 401 and 402. A coupling relationship between the heat dissipation members 304 and 305, the circuit units 401 and 402, and the case 301 will be described with reference to FIGS. 4 and 5.

The refrigerant pipe 306 may be coupled to the heat dissipation members 304 and 305 to configure the cooling unit 112. The refrigerant pipe 306 may cool the heat dissipation members 304 and 305 to increase the heat dissipation efficiency of the heat dissipation members 304 and 305. Regarding the path of the refrigerant inside the refrigerant pipe 306, the refrigerant may be introduced into a first location 302, pass through the first heat dissipation member 304 and the second heat dissipation member 305, and pass through the second heat dissipation member 305 and the first heat dissipation member again, and then discharged to a second location 303.

Figure 6:
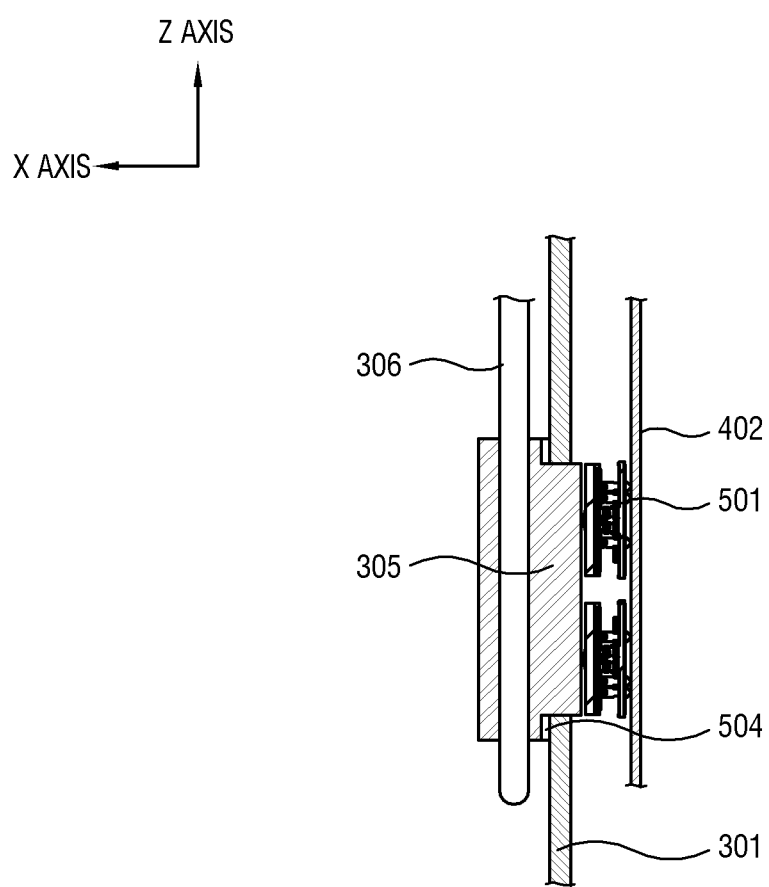
FIG. 6 is a cross-sectional view of the cooling unit according to the embodiment of the present disclosure.

FIG. 6 illustrates the form of the cross section taken along the two-dot chain line A-A' in the perspective view of FIG. 3 when viewed in the −Y axis direction. Hereinafter, the circuit units 401 and 402 of the control box 101 will be described.

Figure 4:
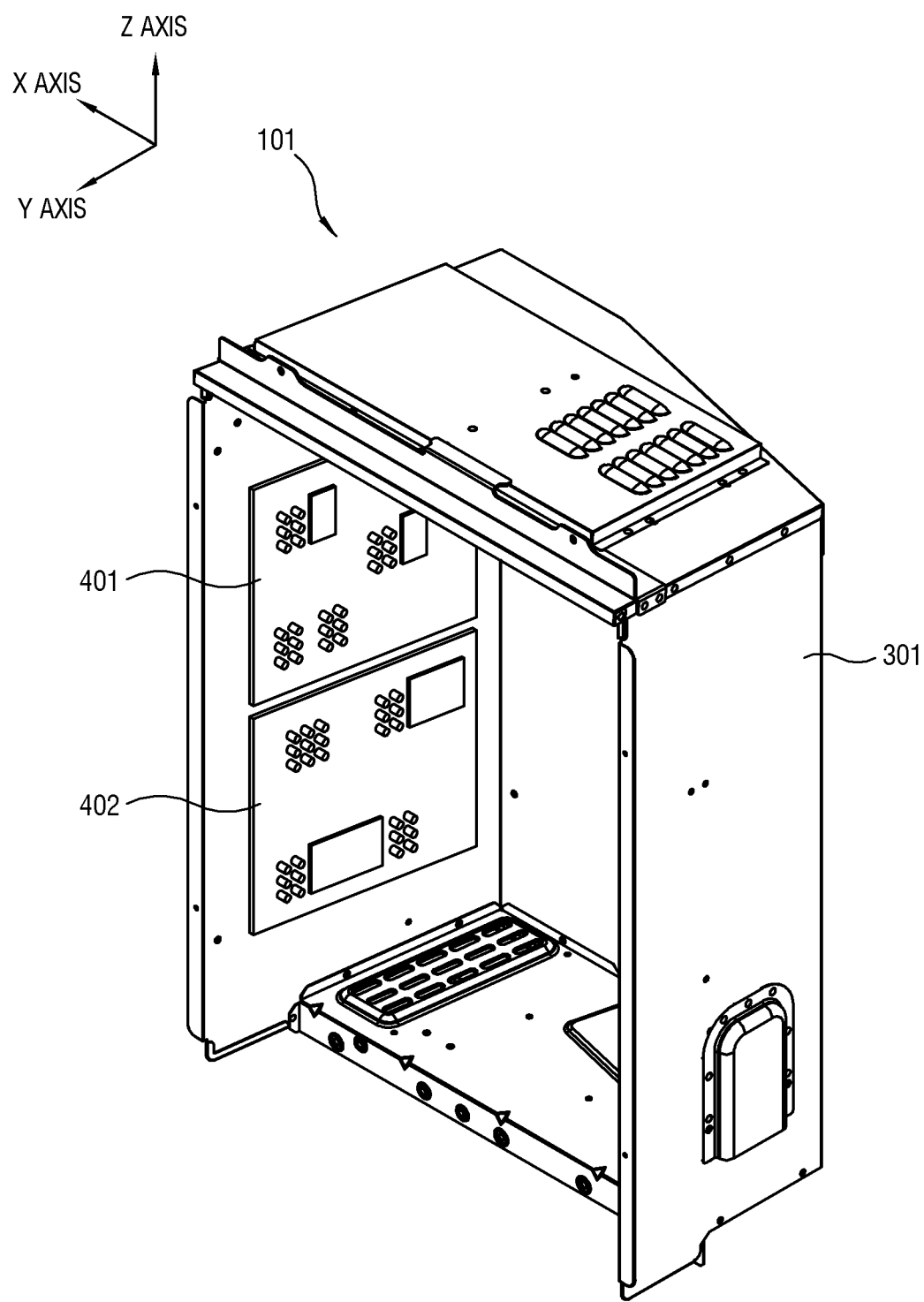
FIG. 4 is a perspective view of the control box according to the embodiment of the present disclosure.

FIG. 4 is another perspective view of the control box according to the embodiment of the present disclosure. The circuit units 401 and 402 may be located inside the case 301. As an example, the circuit units 401 and 402 may each be provided on the inner surface of the case 301, corresponding to each location of the heat dissipation members (304 and 305 in FIG. 3) provided on the outer surface of the case 301. The circuit units 401 and 402 may be provided as a printed circuit board on which circuit elements are mounted. The circuit units 401 and 402 may include a booster circuit that boosts the power of the compressor, the inverter circuit that supplies power to the booster circuit, and the driving circuit required to drive the outdoor unit 100.

Locations corresponding to the heat dissipation members 304 and 305 may be provided with a circuit having the highest level of heat generation in the circuit units 401 and 402, and as a result, the heat dissipation efficiency of the heat dissipation members 304 and 305 can be increased.

Hereinafter, the coupling relationship between the circuit units 401 and 402, the case 301, and the cooling unit 112 will be described.

Figure 5:
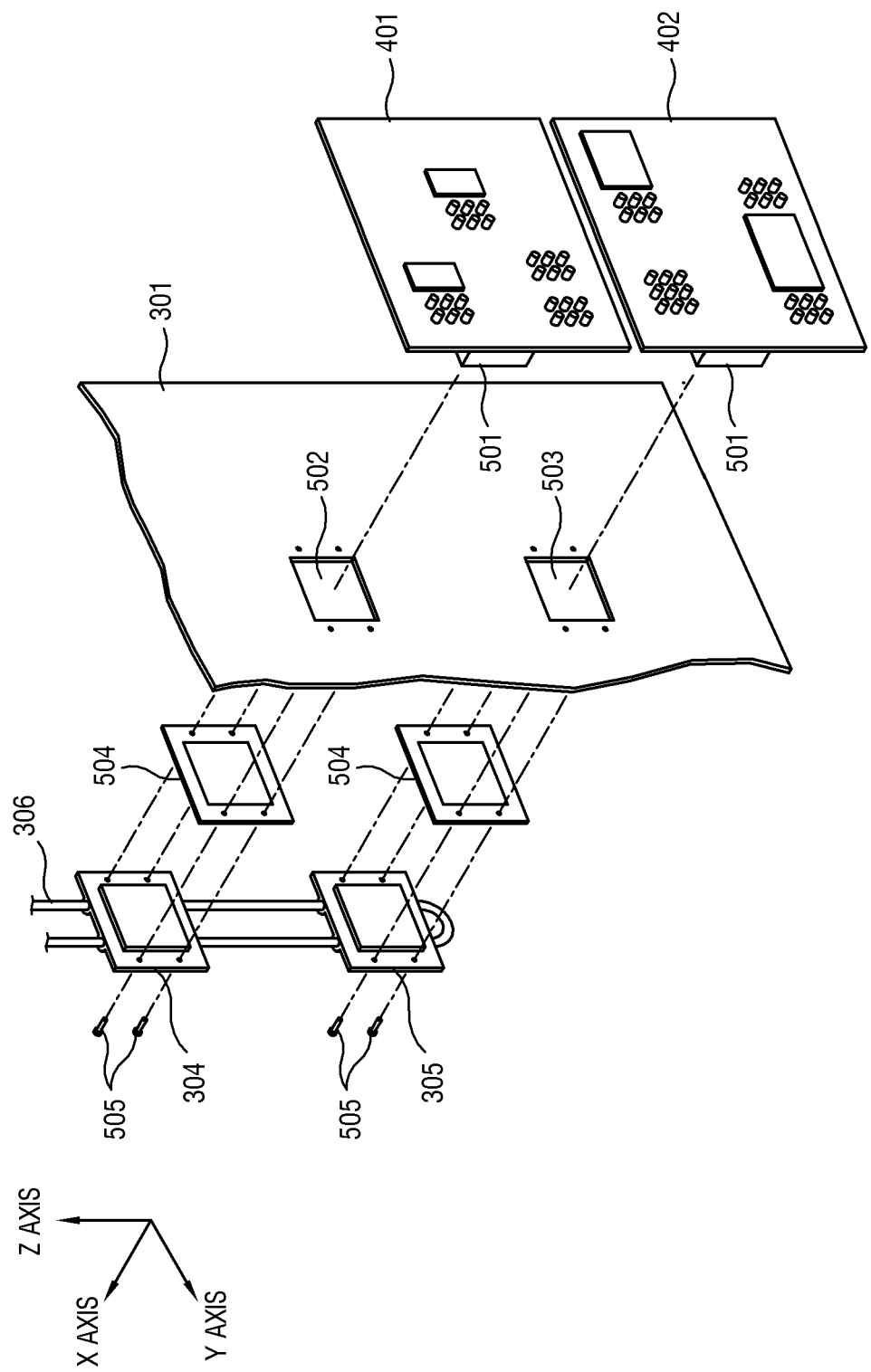
FIG. 5 is an exploded perspective view of a cooling unit according to an embodiment of the present disclosure.

FIG. 5 is an exploded perspective view of the cooling unit according to the embodiment of the present disclosure. The circuit units 401 and 402 may be provided on the inner surface of the case 301. A heat transfer member 501 facing the outside of the case 301 may be provided on the circuit board of the circuit units 401 and 402. The heat transfer members 501 of the circuit board may each be provided corresponding to locations of openings 502 and 503 that are provided on one surface of the case. A bracket 504 may be provided on the outer surface of the case 301 corresponding to the locations of the openings 502 and 503. The heat dissipation members 304 and 305 may penetrate through the bracket 504 and come into thermal contact with the heat transfer member 501 of the circuit board. The heat dissipation member 304 or 305 may exchange heat by contacting the heat transfer member 501 of the circuit board. The heat transfer member 501 of the circuit board may be exposed to the outside of the case 301, and the heat transfer member 501 may protrude outwardly of the case 301 through the openings 502 and 503 to come into thermal contact with the heat dissipation members 304 and 305. Alternatively, a portion of the heat dissipation members 304 and 305 may be penetrated into the case 301 through the openings 502 and 503 to come into thermal contact with the heat transfer member 501 of the circuit board.

The high-temperature heat dissipation members 304 and 305 due to the thermal contact with the heat transfer member 501 of the circuit board may be cooled through the thermal contact with the refrigerant pipe 306. The refrigerant pipe 306 may be provided to move a cold refrigerant. The refrigerant may come into thermal contact with the refrigerant pipe 306 that comes into contact with the heat dissipation members 304 and 305. As a result, the heat transfer member 501 of the circuit board, the heat dissipation members 304 and 305, and the refrigerant pipe 306 may be maintained at a specific temperature.

A screw 505 may be provided to penetrate through the heat dissipation member 304 or 305 and a bracket 504 to be penetrated into the case 301. The screw 505 may fix the heat dissipation member 304 or 305, the bracket 504, and the case

301. The screw 505 may be removable, and the heat dissipation member 304 or 305 may also be removable.

FIG. 6 illustrates the form of the cross section taken along the two-dot chain line A-A' in the perspective view of FIG. 3 when viewed in the −Y axis direction. FIG. 6 is a cross-sectional view in which the heat dissipation member 305, the bracket 504, and the circuit board 402 are coupled to the case 301. In this cross-sectional view, the heat dissipation member 305 penetrates through the case 301 to come into contact with the heat transfer member 501, but the embodiment of the present disclosure is not limited thereto. Therefore, the heat transfer member 501 may penetrate through the case 301 to come into thermal contact with the heat dissipation member 305. In addition, the heat transfer member 501 and the heat dissipation member 305 may be penetrated into the case 301 and thus come into contact with each other. In this cross-sectional view, the heat dissipation member 305, the circuit unit 401, and the case 301 may also be coupled to each other in the same way that the heat dissipation member 305, the circuit unit 402, and the case 301 are coupled to each other.

Figure 7:
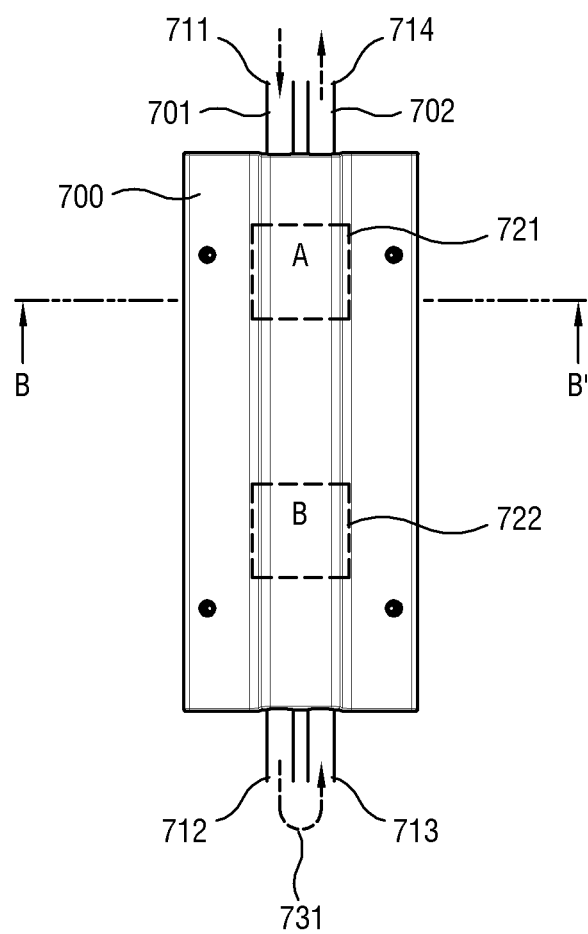
FIG. 7 is a plan view of the cooling unit according to the embodiment of the present disclosure.

FIG. 7 is a plan view of the cooling unit in a Y-Z plane according to the embodiment of the present disclosure. Refrigerant pipes 701 and 702 penetrating through the heat dissipation member of the cooling unit 700 may be provided. The refrigerant may move to be introduced into a first location 711 of the first refrigerant pipe 701 and discharged to a second location 712 of the first refrigerant pipe 701. The refrigerant may move to be introduced into a third location 713 of the second refrigerant pipe 702 and discharged to a fourth location 714 of the second refrigerant pipe 702. A U-shaped third refrigerant pipe 731 may be provided at the second location 712 of the first refrigerant pipe 701 and the third location 713 of the second refrigerant pipe 702.

The refrigerant can move along the path of the refrigerant pipe. For example, the refrigerant may be introduced from the first location 711 and discharged to the fourth location 714 through the second location 712 and the third location 713. The path of the refrigerant pipe and the direction of movement of the refrigerant are one embodiment according to the present disclosure, and the path of the refrigerant pipe and the direction of movement of the refrigerant in the present disclosure are not limited thereto.

Heat may be generated in the circuit unit 111 due to the operation of the outdoor unit 100. The heating unit is schematically represented by A 721 and B 722. The refrigerant may dissipate heat of the heating units A 721 and B 722 while circulating the refrigerant pipes 701 and 702 along the path of the refrigerant pipes 701 and 702.

Figure 8:
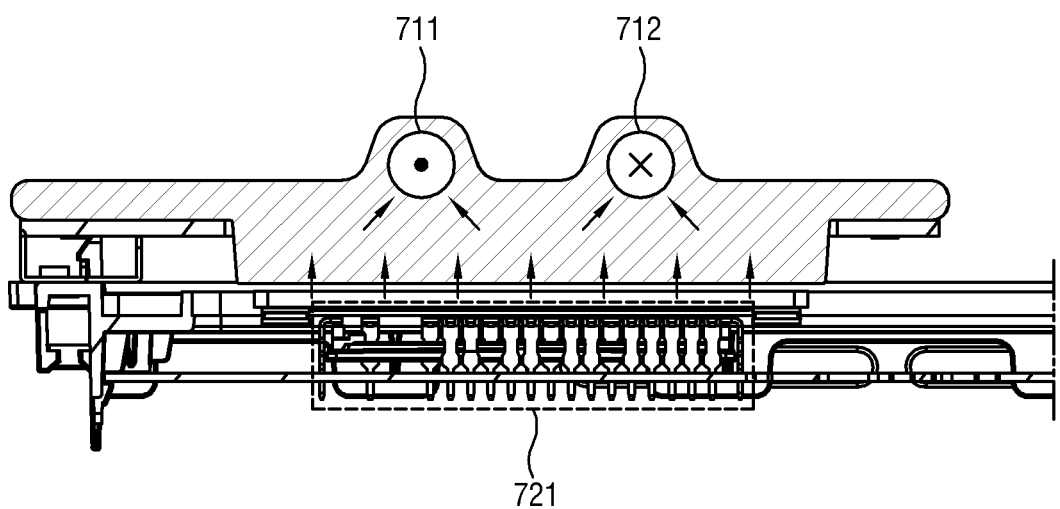
FIG. 8 is a cross-sectional view of the cooling unit according to the embodiment of the present disclosure.

FIG. 8 illustrates a cross-sectional view of the cooling unit according to the embodiment of the present disclosure. In detail, FIG. 8 illustrates a cross section taken along the two-dot chain line B-B' in the cross-sectional view of FIG. 7 when viewed in the Z-axis direction. The refrigerant in the refrigerant pipe 701 flows in the −Z-axis direction. The refrigerant in the refrigerant pipe 702 flows in the Z-axis direction.

The heat generated in the heating unit A 721 is transferred to the heat dissipation member in the X-axis direction, and the heat of the heat dissipation member is transferred to the refrigerant pipes 701 and 702. The arrow indicates the direction of movement of the heat.

The refrigerant pipe 306 may be inserted into the heat dissipation members 304 and 305. The refrigerant pipe 306 is inserted into the heat dissipation members 304 and 305, and as a result, the area of the refrigerant pipe 306 that comes into thermal contact with the heat dissipation members 304 and 305 is widened. As the area of the thermal contact increases, the efficiency of the heat exchange may increase.

The cooling unit illustrated in FIG. 8 is manufactured by inserting the refrigerant pipe into the heat dissipation member using a die casting method. Hereinafter, a process of manufacturing the cooling unit including the refrigerant pipe and the heat dissipation member will be described with reference to FIGS. 16 and 17.

Figure 16:
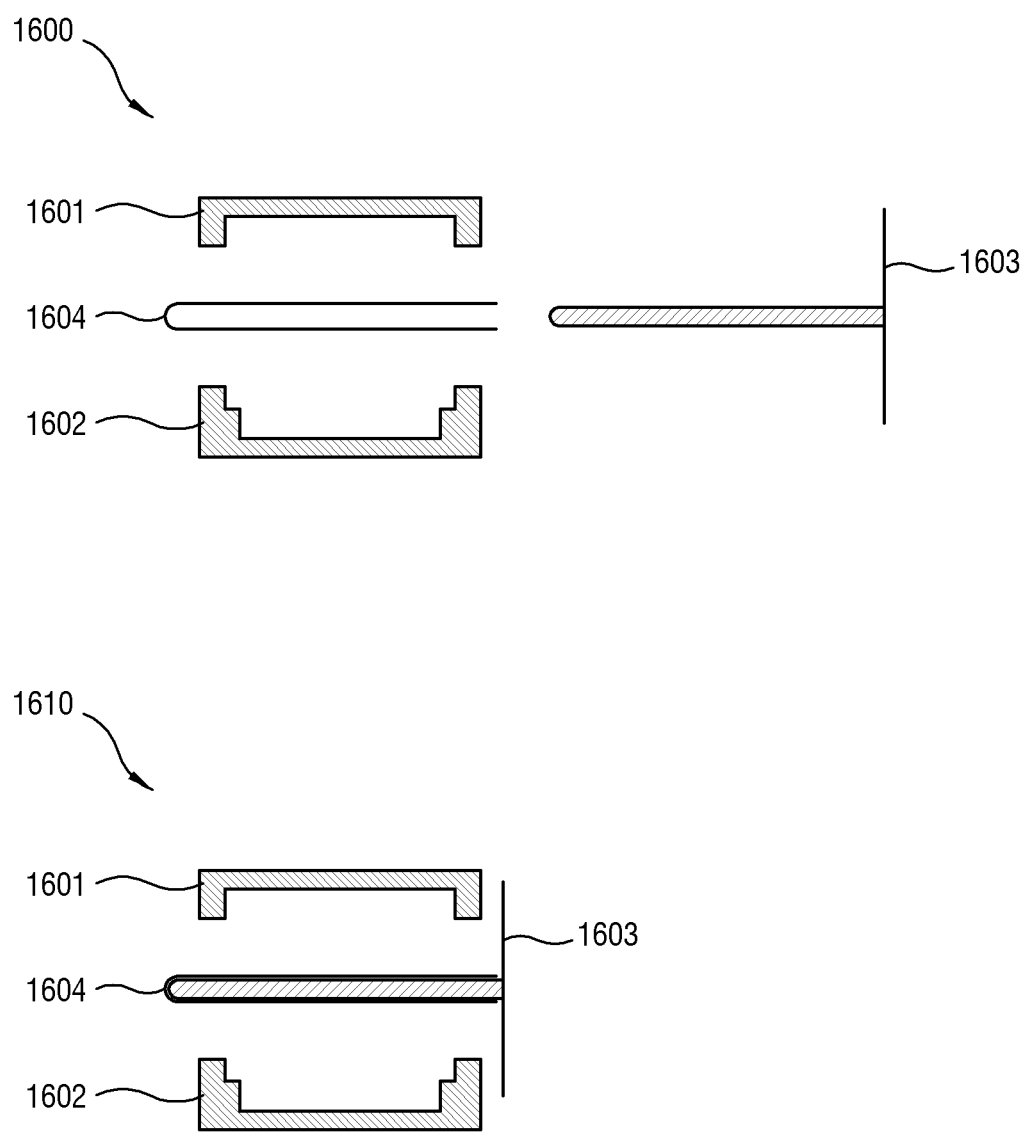

FIGS. 16 and 17 are diagrams illustrating a process of manufacturing the cooling unit according to the embodiment of the present disclosure. The cooling unit including the refrigerant pipe and the heat dissipation member can be manufactured using a mold. It is possible to use a die casting method in which molten metal is injected into the mold and the injected molten metal is cooled to manufacture a casting. In the present disclosure, the mold may include an upper mold 1601 and a lower mold 1602 (see reference numeral 1600).

The upper mold 1601 and the lower mold 1602 may be coupled to each other. When the upper mold 1601 and the lower mold 1602 are coupled to each other, internal spaces 1606 and 1607 may be provided between the upper mold 1601 and the lower mold 1602 (see reference number 1620). A portion or the whole of the refrigerant pipe 1604 may be provided in the internal spaces 1606 and 1607.

A guide 1603 that may maintain the location of the refrigerant pipe 1604 may be provided in the mold. The guide 1603 may be provided to be inserted into the refrigerant pipe 1604. The guide 1603 may maintain a relative positional relationship between the refrigerant pipe 1604 and the mold inside the refrigerant pipe 1604.

Molten metal 1608 is injected into the mold and then cooled, and thus may be manufactured as the cooling unit including the refrigerant pipe and the heat dissipation member. Hereinafter, the process of manufacturing the cooling unit will be described.

Before the upper mold 1601 and the lower mold 1602 are coupled to each other, the refrigerant pipe 1604 may be provided between the upper mold 1601 and the lower mold 1602 (see reference number 1600). The refrigerant pipe 1604 may be provided to have the guide 1603 inserted thereinto (see reference numeral 1610). After the guide 1603 is inserted into the refrigerant pipe 1604, the upper mold 1601 and the lower mold 1602 may be coupled to each other (see reference numeral 1620). When the upper mold 1601 and the lower mold 1602 are coupled to each other, the internal spaces 1606 and 1607 are provided between the upper mold 1601 and the lower mold 1602. The refrigerant pipe 1604 into which the guide 1603 is inserted may be provided in the interior spaces 1606 and 1607. In addition, the molten metal 1608 may be injected into the interior spaces 1606 and 1607. While the molten metal 1608 is injected and cooled, the guide 1603 may maintain the positional relationship between the refrigerant pipe 1604 and the mold. The molten metal 1608 is cooled with a heat dissipation member 1609. The refrigerant pipe 1604 may penetrate through the heat dissipation member 1609 (see reference numeral 1640). In the process of manufacturing the cooling unit, the change in the relative position between the refrigerant pipe 1604 and the heat dissipation member 1609 may be minimized. In addition, the area of the refrigerant pipe 1604 in contact with the heat dissipation member 1609 is widened, and the gap between the refrigerant pipe 1604 and the heat dissipation member 1609 is minimized, so the heat dissipation effect and the cooling effect may increase.

The process of manufacturing the cooling unit is not limited to the manufacturing process described above. Therefore, the process of coupling the upper mold 1601 and the lower mold 1602, the process of inserting the refrigerant pipe 1604 into the mold, and the process of inserting the guide 1603 may be reordered by a person skilled in the art. Therefore, unlike the previous description, the upper mold 1601 and the lower mold 1602 may be coupled to each other, and the refrigerant pipe 1604 into which the guide 1603 is inserted may be provided inside the mold.

Figure 9:
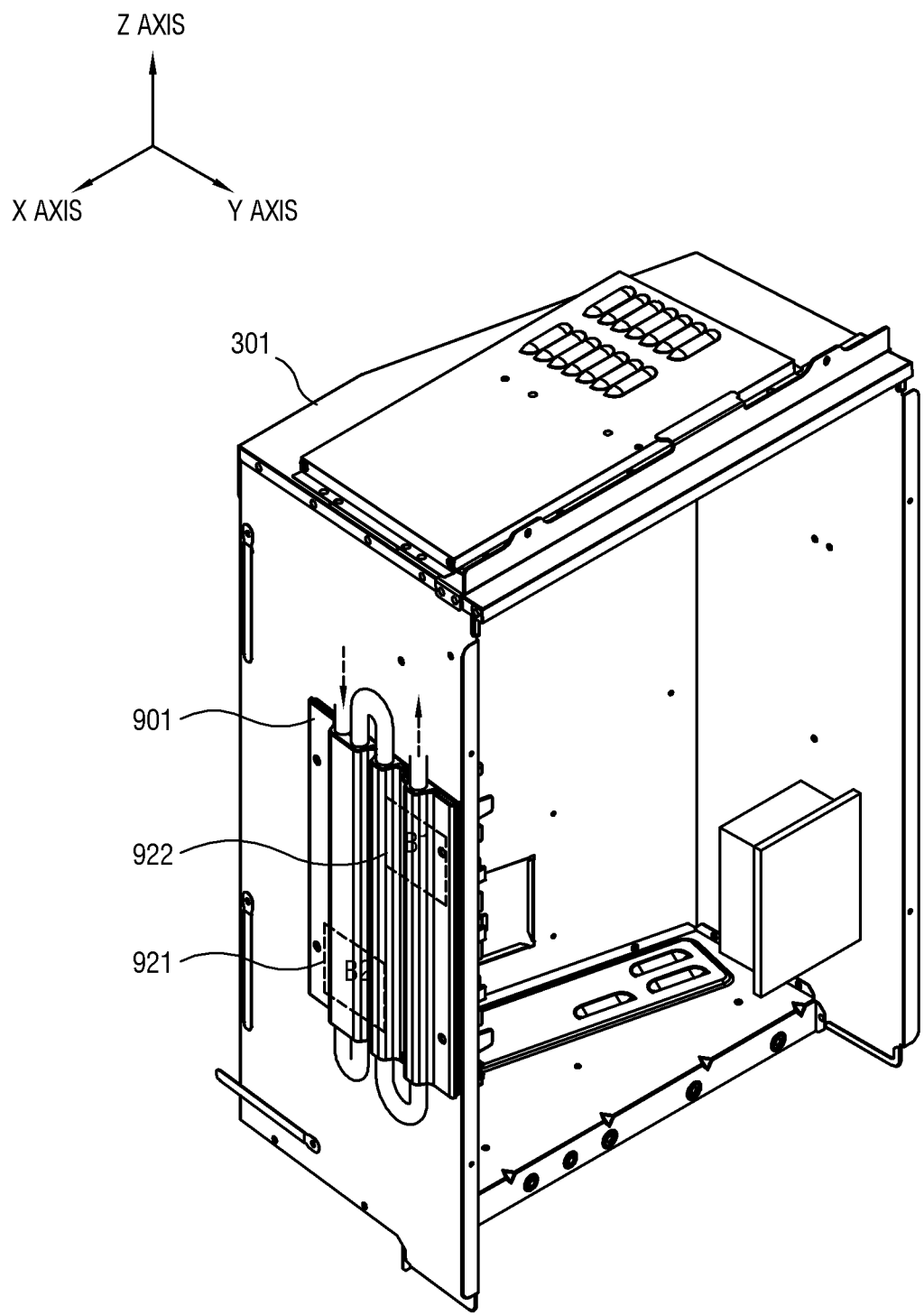
FIG. 9 is a perspective view of the control box according to the embodiment of the present disclosure.

FIG. 9 is a perspective view of the control box according to the embodiment of the present disclosure. Heat may be generated in the circuit unit 111 due to the operation of the outdoor unit 100. The heating unit is schematically represented by A1 921 and B1 922. A region of the cooling unit 901 in the Y-Z plane may further include heating units other than the heating units A1 921 and B1 922. The path of the refrigerant pipe in the region of the cooling unit 901 including a plurality of heating units may be different from those of the refrigerant pipes 701 and 702 described above. The refrigerant pipes 701 and 702 may traverse heating units A1 911 and B1 912 multiple times as illustrated in FIG. 9. Hereinafter, the cooling unit 901 of FIG. 9 will be described.

Figure 10:
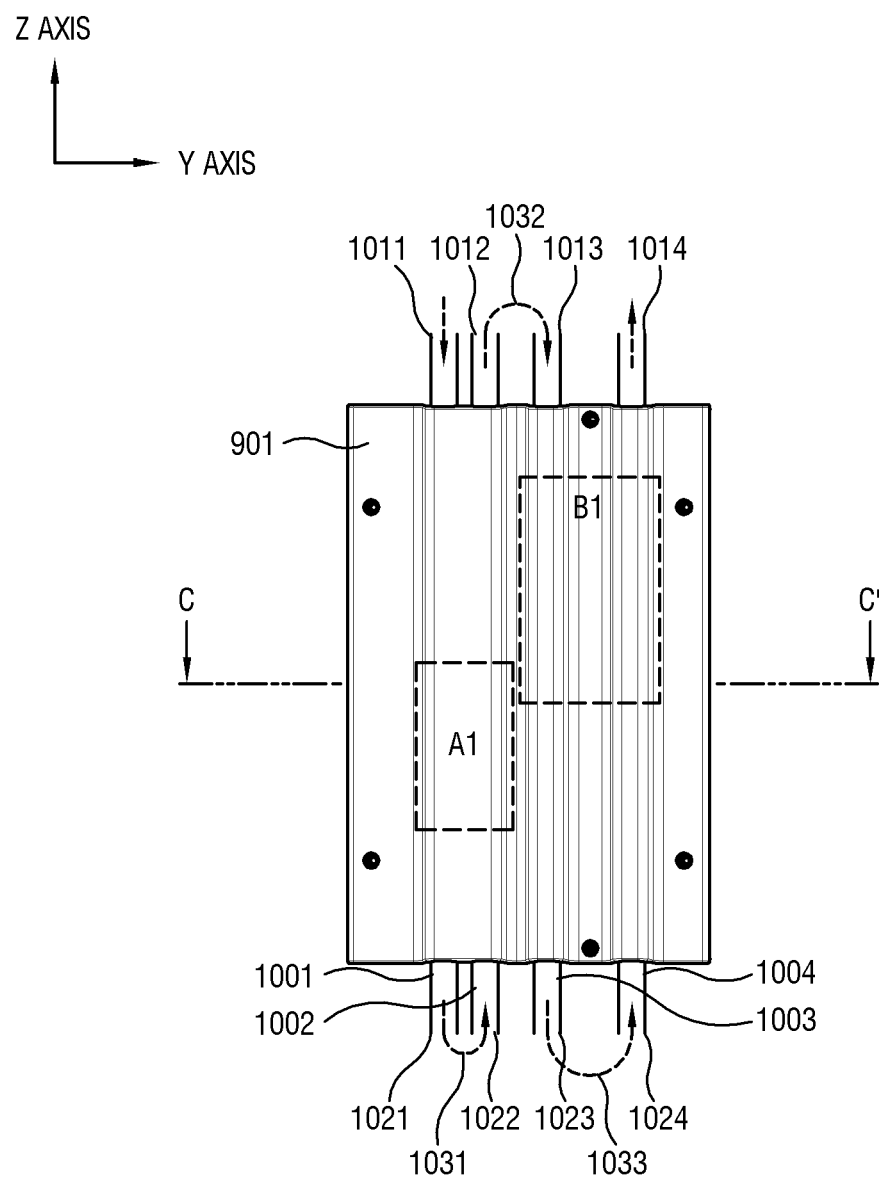
FIG. 10 is a plan view of the cooling unit according to the embodiment of the present disclosure.

FIG. 10 is a plan view of the cooling unit 900 in the Y-Z plane according to the embodiment of the present disclosure. Refrigerant pipes 1001 to 1004 penetrating through the heat dissipation member of the cooling unit 901 may be provided. The refrigerant may move to be introduced into a first location 1011 of the first refrigerant pipe 1001 and discharged to a second location 1021 of the first refrigerant pipe 1001. The refrigerant may move to be introduced into a third location 1022 of the second refrigerant pipe 1002 and discharged to a fourth location 1012 of the second refrigerant pipe 1002. The refrigerant may move to be introduced into a fifth location 1013 of the third refrigerant pipe 1003 and discharged to a sixth location 1023 of the third refrigerant pipe 1003. The refrigerant may move to be introduced into a seventh location 1014 of the fourth refrigerant pipe 1004 and discharged to an eighth location 1024 of the fourth refrigerant pipe 1004.

A U-shaped fifth refrigerant pipe 1031 may be provided at the second location 1021 and the third location 1022. A U-shaped seventh refrigerant pipe 1012 may be provided at the fourth location 1012 and the fifth location 1013. A U-shaped sixth refrigerant pipe 1032 may be provided at the sixth location 1023 and the seventh location 1024. The refrigerant pipes 1031 to 1033 described above may be provided to connect each location 1002, 1003, and 1021 to 1024 of the heat dissipation member to make the refrigerant flow.

After the refrigerant traverses the heating unit A1 921 multiple times along the paths of the refrigerant pipes 1001 and 1002 and traverses the heating unit B1 922 multiple times along the paths of the refrigerant pipes 1003 and 1004, the refrigerant may be discharged to the eighth location 1014. Accordingly, the refrigerant may sequentially cool the heating units A1 921 and B1 922.

Hereinafter, a cross section of the cooling unit 901 will be described.

Figure 11:
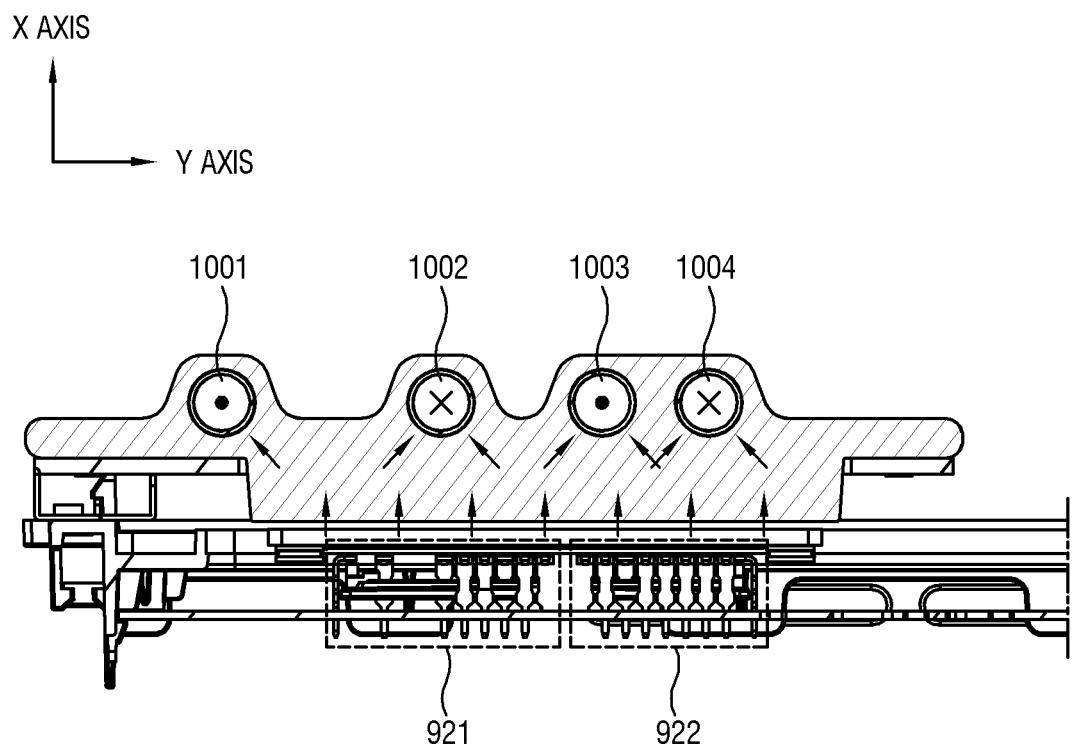
FIG. 11 is a cross-sectional view of the cooling unit according to the embodiment of the present disclosure.

FIG. 11 illustrates a cross-sectional view of the cooling unit according to the embodiment of the present disclosure. In detail, FIG. 11 illustrates the form of the cooling unit 901 of FIG. 10 taken along the two-dotted chain line C-C' when viewed in the Z-axis direction. In FIG. 11, descriptions of components 921 and 922 of the cooling unit 901 already described with reference to the description in FIG. 10 will be omitted.

In the first refrigerant pipe 1001 and the third refrigerant pipe 1003, the refrigerant may move in the −Z-axis direction. In the second refrigerant pipe 1002 and the fourth refrigerant pipe 1004, the refrigerant may move in the Z-axis direction.

The heat generated in the heating units A1 921 and B1 922 is transferred to the heat dissipation member in the X-axis direction, and the heat of the heat dissipation member is transferred to the refrigerant pipes 1001 to 1004. The arrow indicates the direction of movement of the heat.

Figure 12:
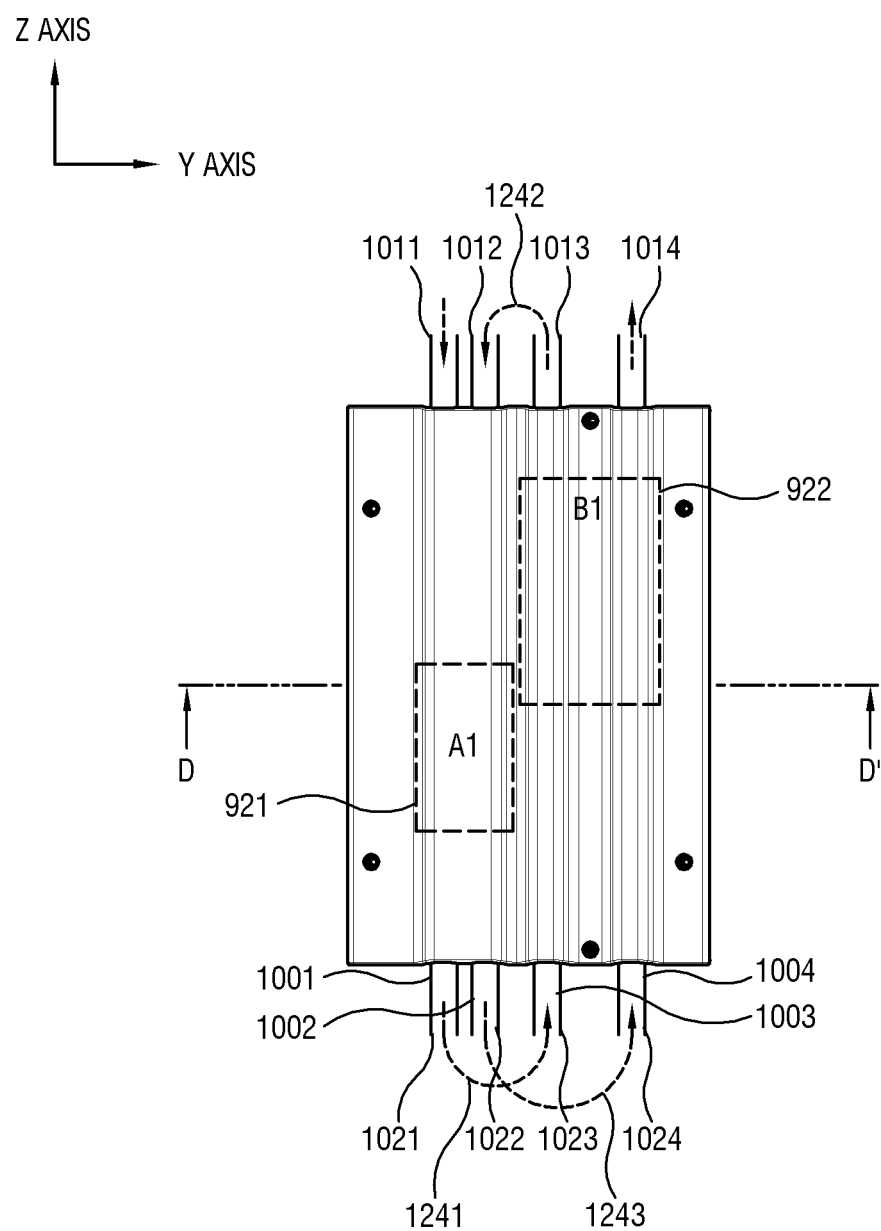
FIG. 12 is a plan view of the cooling unit according to the embodiment of the present disclosure.

FIG. 12 is a plan view of the cooling unit in the Y-Z plane according to the embodiment of the present disclosure. In FIG. 12, description of the components 921, 922, 1001 to 1004, 1011 to 1014, and 1021 to 1024 of the cooling unit 901 already described with reference to FIG. 10 will be omitted.

The refrigerant pipes 1001 to 1004 penetrating through the heat dissipation member of the cooling unit 1200 may be provided.

A U-shaped refrigerant pipe 1241 may be provided at the second location 1021 and the sixth location 1023 of the cooling unit 901. A U-shaped refrigerant pipe 1242 may be provided at the fifth location 1013 and the fourth location 1003 of the cooling unit 901. A U-shaped refrigerant pipe 1243 may be provided at the third location 1022 and the seventh location 1024 of the cooling unit 901. The refrigerant pipes 1241 to 1243 described above may be provided to connect each location 1001 to 1004, and 1021 to 1024 of the cooling unit 901 to make the refrigerant flow.

The refrigerant may be introduced into a first location 1011 along the path of the first refrigerant pipe 1001, may traverse the heating unit A1 921, and may be discharged from the second location 1021. The refrigerant discharged from the second location 1021 may be introduced into the sixth location 1023, may traverse the heating unit B1 922 along the path of the third refrigerant pipe 1003, and may be discharged from the fifth location 1013. The refrigerant discharged from the fifth location 1021 may be introduced into the fourth location 1012, may traverse the heating unit A1 921 along the path of the second refrigerant pipe 1002 again, and may be discharged to the third location 1022. The refrigerant discharged from the third location 1022 may be introduced into the seventh location 1024 of the fourth refrigerant pipe 1004, may traverse the heating unit B1 922 again, and may be discharged to the eighth location 1014. The refrigerant may move to sequentially pass through the heating units A1 921 and B1 922 and pass through the heating units A1 921 and B1 922 again. Accordingly, the refrigerant may uniformly cool the heating units A1 921 and B1 922. In addition, the U-shaped refrigerant pipes 1241 and 1243 have a larger rotational radius than in the case of connecting adjacent refrigerant pipes, and as a result, the assembly performance may be improved.

Hereinafter, a cross section of the cooling unit 1200 will be described.

Figure 13:
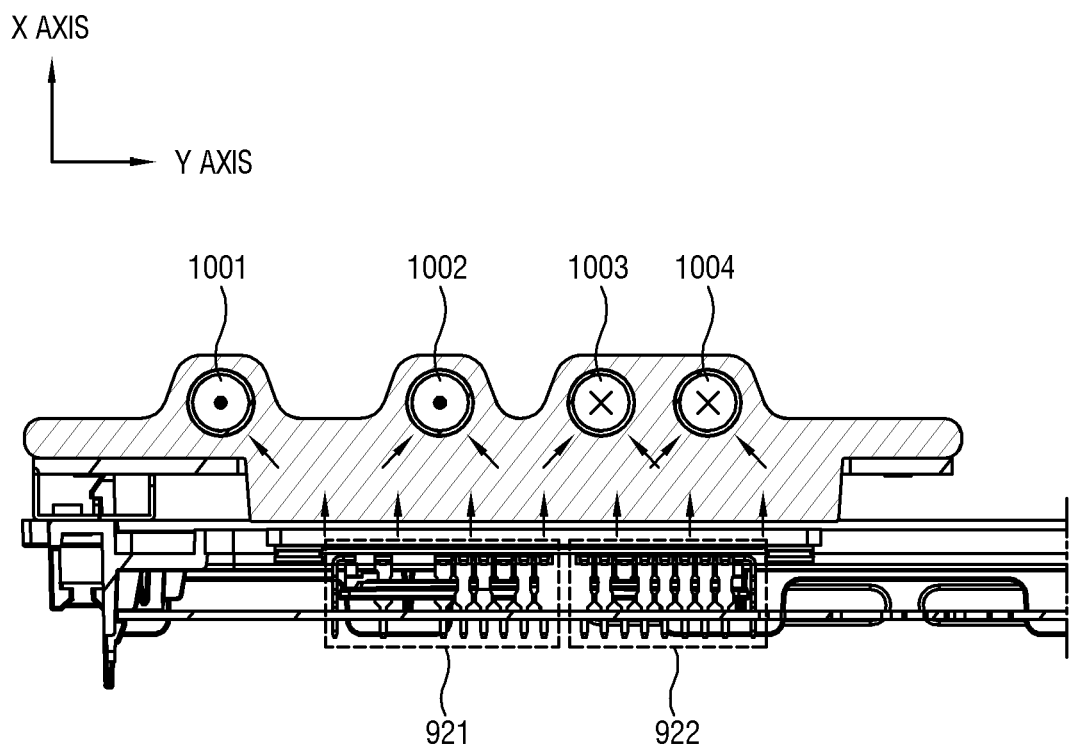
FIG. 13 is a cross-sectional view of the cooling unit according to the embodiment of the present disclosure.

FIG. 13 illustrates a cross-sectional view of the cooling unit according to the embodiment of the present disclosure. In detail, FIG. 13 illustrates the form of the cooling unit 1200 of FIG. 12 taken along the two-dotted chain line D-D' when viewed in the Z-axis direction. In FIG. 13, the descriptions of the components 921 and 922 of the cooling unit 1200 already described with reference to the description in FIG. 12 will be omitted.

In the refrigerant pipes 1001 and 1002, the refrigerant may move in the −Z-axis direction. In the refrigerant pipes 1003 and 1004, the refrigerant may move in the Z-axis direction.

The heat generated in the heating units A1 921 and B1 922 is transferred to the heat dissipation member in the X-axis direction, and the heat of the heat dissipation member is transferred to the refrigerant pipes 1001 to 1004. The arrow indicates the direction of movement of heat.

Figure 14:
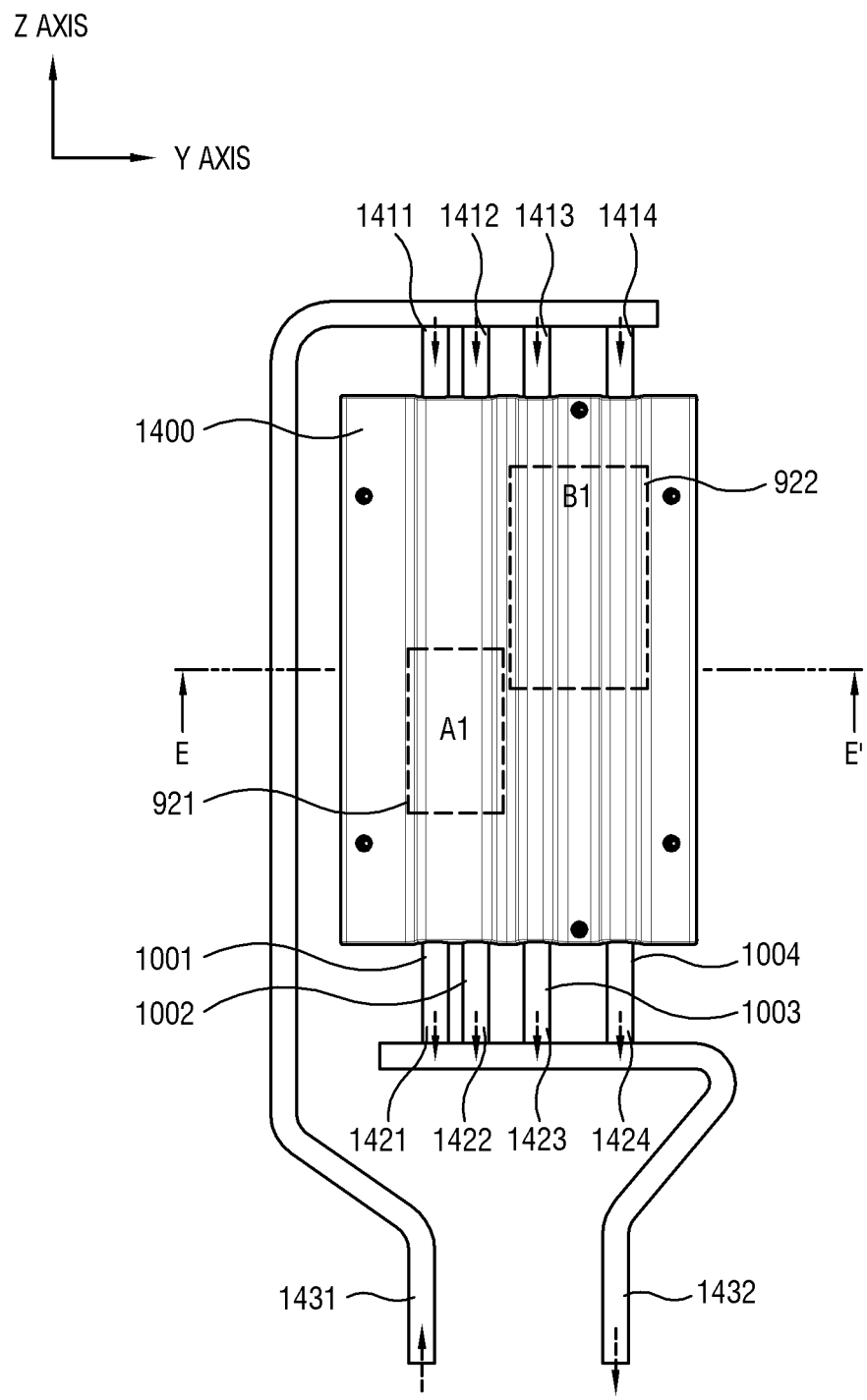
FIG. 14 is a plan view of the cooling unit according to the embodiment of the present disclosure.

FIG. 14 is a plan view of the cooling unit in the Y-Z plane according to the embodiment of the present disclosure. In FIG. 14, the description of the components 921, 922 and 1001 to 1004 of the cooling unit 1400 already described with reference to FIGS. 10 and 12 will be omitted.

A first refrigerant pipe 1431 and a second refrigerant pipe 1432 facing each other with the cooling unit 1400 provided therebetween are provided. The first refrigerant pipe 1431 and the second refrigerant pipe 1432 communicate with each other by the third refrigerant pipes 1001 to 1004. The third refrigerant pipes 1001 to 1004 may be provided to penetrate through the heat dissipation member of the cooling unit 1400.

The refrigerant may be introduced into a first location 1411, a third location 1412, a fifth location 1413, and a seventh location 1414 of the cooling unit 1400 from the first refrigerant pipe 1431. The introduced refrigerant may traverse the heating units A1 921 and B1 922 and may be discharged to a second location 1421, a fourth location 1422, a sixth location 1423, and an eighth location 1424. The discharged refrigerant is introduced into the second refrigerant pipe 1432 and may be circulated along the path of the refrigerant pipe. Accordingly, the refrigerant may uniformly cool the heating units A1 921 and B1 922.

Hereinafter, a cross section of the cooling unit 1400 will be described.

Figure 15:
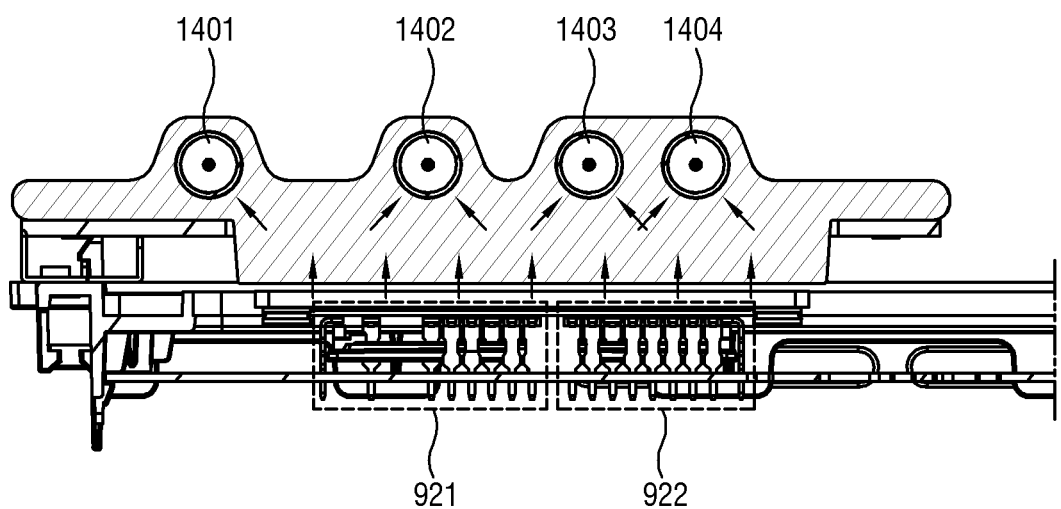
FIG. 15 is a cross-sectional view of the cooling unit according to the embodiment of the present disclosure.

FIG. 15 illustrates a cross-sectional view of the cooling unit according to the embodiment of the present disclosure. In detail, FIG. 15 illustrates the form of the cooling unit 1400 of FIG. 14 taken along the two-dotted chain line E-E' when viewed in the Z-axis direction. In FIG. 15, the descriptions of the components 921 and 922 of the cooling unit 1400 already described with reference to the description in FIG. 14 will be omitted.

In third refrigerant pipes 1401 and 1404, the refrigerant may move in the −Z-axis direction. The heat generated in the heating units A1 921 and B1 922 is transferred to the heat dissipation member in the X-axis direction, and the heat of the heat dissipation member is transferred to the third refrigerant pipes 1001 to 1004. The arrow indicates the direction of movement of the heat.

The invention claimed is:

1. An outdoor unit of an air conditioner, comprising:
a compressor configured to compress a first refrigerant introduced from an indoor unit of the air conditioner;
a condenser configured to condense the first refrigerant compressed by the compressor;
a first driving circuit configured to drive the compressor;
a second driving circuit configured to regulate a voltage of the first driving circuit; and
a cooling unit, wherein the cooling unit comprises:
a heat dissipation member configured to come into thermal contact with the first driving circuit and the second driving circuit; and
a refrigerant pipe configured to be provided in the heat dissipation member, and having a path along which a second refrigerant moves through the first driving circuit and the second driving circuit,
wherein the path includes a first section and a second section which traverse the first driving circuit, and a third section and a fourth section which traverse the second driving circuit, and wherein the path is extended such that the second refrigerant sequentially flows along the first section, the third section, the second section and the fourth section.

2. The outdoor unit of claim 1, wherein the first driving circuit comprises an inverter circuit, and the second driving circuit comprises a booster circuit.

3. The outdoor unit of claim 1, wherein the refrigerant pipe is configured to penetrate through an inside of the heat dissipation member.

4. The outdoor unit of claim 1, wherein the refrigerant pipe comprises a first refrigerant pipe and a second refrigerant pipe that face each other with the heat dissipation member provided therebetween, and
comprises a plurality of third refrigerant pipes that transverse the heat dissipation member to make the first refrigerant pipe and the second refrigerant pipe communicate with each other.

5. The outdoor unit of claim 1, wherein a material of the pipe comprises at least any one of copper, aluminum, or iron.

6. The outdoor unit of claim 1, further comprising:
a control box that is provided with the first driving circuit and the second driving circuit,
wherein at least one of the heat dissipation member or the refrigerant pipe is exposed outside the control box.

7. The outdoor unit of claim 6, wherein the control box is provided with an opening that is at a location corresponding to at least one of the first driving circuit and the second driving circuit.

8. The outdoor unit of claim 6, further comprising:
an exterior case that houses the compressor, the condenser, and the control box.

* * * * *